(12) United States Patent
Zhang et al.

(10) Patent No.: US 8,456,346 B2
(45) Date of Patent: Jun. 4, 2013

(54) DATA CONVERTER FOR CONVERTING WAVEFORM SIGNAL TO DIGITAL DATA

(75) Inventors: Ju-Yuan Zhang, Shenzhen (CN); Zhang-Yong Zheng, Shenzhen (CN); Bi-Qing Luo, Shenzhen (CN); Xin Lu, Shenzhen (CN); Shih-Fang Wong, New Taipei (TW)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 64 days.

(21) Appl. No.: 13/212,193

(22) Filed: Aug. 18, 2011

(65) Prior Publication Data
US 2012/0182169 A1 Jul. 19, 2012

(30) Foreign Application Priority Data
Jan. 14, 2011 (CN) ............................ 2011 1 0007763

(51) Int. Cl.
*H03M 1/12* (2006.01)
(52) U.S. Cl.
USPC ............................................ 341/155; 341/50
(58) Field of Classification Search
USPC ............................ 341/50, 155, 113, 142, 135
See application file for complete search history.

(56) References Cited

U.S. PATENT DOCUMENTS

| | | | |
|---|---|---|---|
| 6,466,088 B1 * | 10/2002 | Rezvani et al. | 330/51 |
| 8,082,160 B2 * | 12/2011 | Collins et al. | 705/2 |
| 2005/0154766 A1 * | 7/2005 | Huang et al. | 707/104.1 |
| 2006/0259649 A1 * | 11/2006 | Hsieh et al. | 710/8 |
| 2007/0160067 A1 * | 7/2007 | Hayward | 370/397 |
| 2010/0141499 A1 * | 6/2010 | Mathe | 341/172 |

* cited by examiner

*Primary Examiner* — Peguy Jean Pierre
(74) *Attorney, Agent, or Firm* — Altis Law Group, Inc.

(57) ABSTRACT

A data converter includes a signal input port, a processing unit, and an output port. The signal input port includes a number of ports for connecting to corresponding ports of an electronic device and receiving waveform signals from the electronic device. The processing unit includes a port detection module for detecting which port of the signal input port is receiving the waveform signals and a data conversion module including a number of conversion sub-modules, each conversion sub-module corresponds to one port of the signal input port. When the port detection module detects the port receiving the waveform signals, the conversion sub-module corresponding to the detected port is enabled and converts the waveform signals to digital data. Then the output port outputs the digital data to a computer, and the communication state of the port of the electronic device is analyzed via the computer based on the digital data.

4 Claims, 2 Drawing Sheets

DATA CONVERTER FOR CONVERTING WAVEFORM SIGNAL TO DIGITAL DATA

BACKGROUND

1. Technical Field

The present disclosure relates to converters and, particularly, to a data converter for converting waveform signal to digital data.

2. Description of Related Art

To ensure the quality of the electronic devices with communications ports, testing the communication state of the ports is needed. When testing a port of the electronic device, the electronic device needs to connect to another electronic device and transmit or receive waveform signals via the port. Since the waveform signals cannot be received or analyzed by a computer directly, an oscillograph is usually used to capture the waveform signals and display the waveform signals, and then a tester judges the communication state of the port according to the display of the oscillograph. However, if the waveform signal is very long, the oscillograph cannot display the complete waveform signal at one time, which can cause the tester to make wrong judgments.

Therefore, it is desirable to provide a data converter to overcome the described limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail, with reference to the accompanying drawings.

Figure 1:
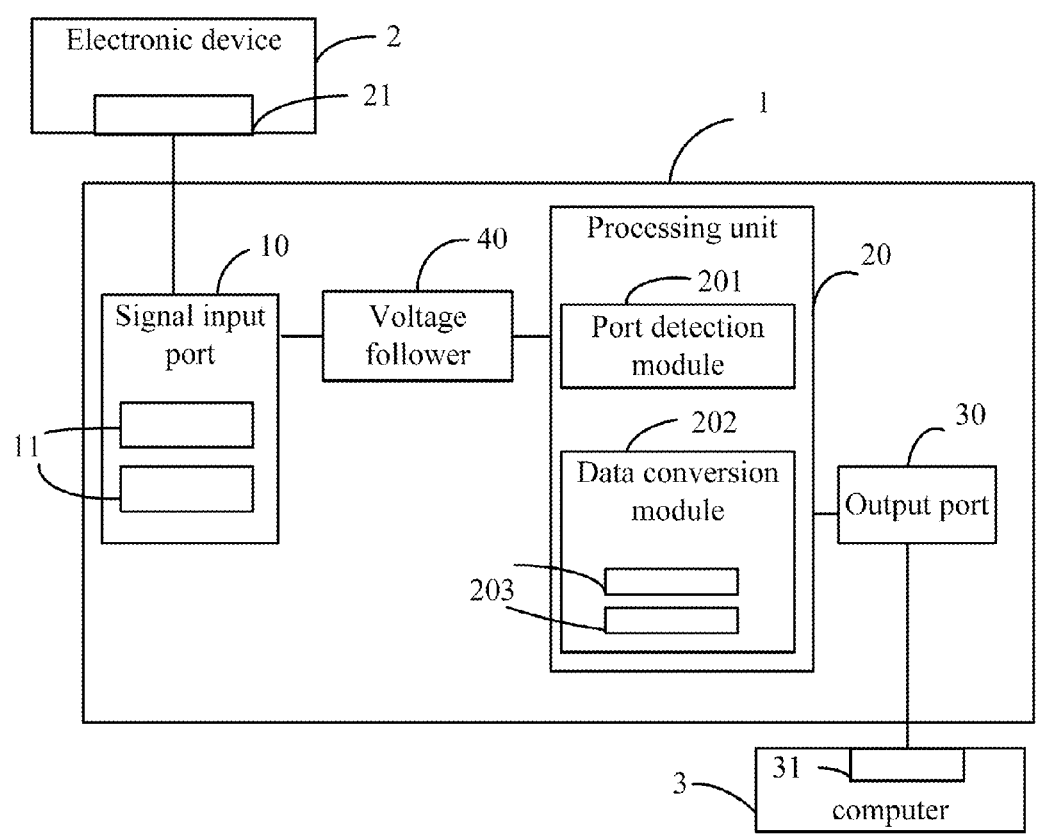
FIG. 1 is a block view of a data converter, in accordance with an exemplary embodiment.

Referring to FIG. 1, a data converter 1 includes a signal input port 10, a processing unit 20, and an output port 30. The signal input port 10 includes a number of ports 11 of different types, for example, a USB port, an IEEE 1394 port, and a Video Graphics Array port. Each port 11 is used to connect to a corresponding port 21 of an electronic device 2 to be tested, and receive waveform signals from the electronic device 2. The processing unit 20 includes a port detection module 201 and a data conversion module 202. The data conversion module 202 includes a number of conversion sub-modules 203. Each of the conversion sub-modules 203 corresponds to one port 11 of the signal input port 10. The port detection module 201 is used to detect which port 11 is receiving the waveform signals, and enable the corresponding data conversion sub-module 203 to convert the waveform signals to digital data. The output port 30 is used to connect to a corresponding port 31 of a computer 3, and transmit the digital data to the computer 3 via the port 31. The computer 3 receives the digital data and analyzes the communication state of the port 21 of the electronic device 2.

In one embodiment, the data converter 1 further includes a voltage follower 40. The voltage follower 40 connects the ports 11 of the signal input port 10 and the processing unit 20, and is used to reduce the loss of the waveform signal transmitted to the processing unit 20.

Figure 2:
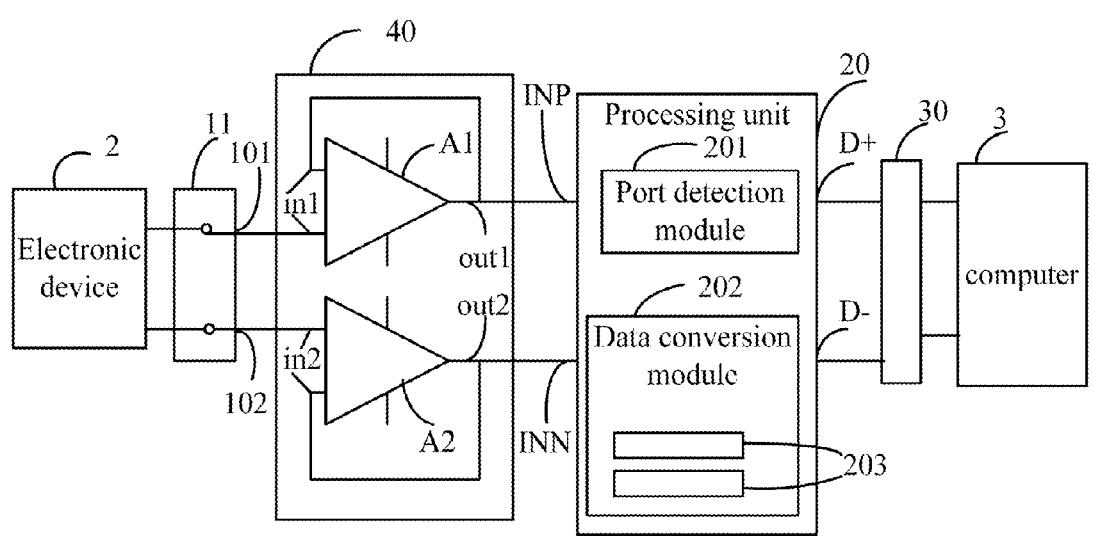
FIG. 2 is a circuit diagram of the data converter of FIG. 1.

Referring to FIG. 2, each port 11 of the signal input port 10 includes an anode input terminal 101 for receiving plus waveform signals and a cathode input terminal 102 for receiving minus waveform signals. In FIG. 2, only one port 11 is shown. The voltage follower 40 includes two amplifiers A1 and A2. The amplifier A1 includes two input ports in1 and an output port out1, and the amplifier A2 also includes two input ports in2 and an output port out2. One of the input ports in1 of the amplifier A1 is connected to the anode input terminal 101 of all of the ports 11, and the other input port in1 is connected to the output port out1. One of the input ports in2 of the amplifier A2 is connected to the cathode input terminal 102 of all of the ports 11, and the other input port in2 is connected to the output port out2. The processing unit 20 includes two signal input pins INP, INN, and two data output pins D+, D−. The signal input pins INP, INN are respectively connected to the output port out1 of the amplifier A1 and the output port out2 of the amplifier A2. When one of the ports 11 receives the waveform signals from the electronic device 2, the amplifiers A1, A2 respectively reduces the loss of the plus waveform signals and the minus waveform signals of the waveform signal, and then respectively transmits the plus waveform signal and the minus waveform signal to the signal input pins INP, INN of the processing unit 20.

In one embodiment, a connection line (not labeled) connected between one of the input ports in1 and the output port out1, and a connection line connected between one of the input port in2 and the output port out2 are wrapped with a shield case, which further reduces the loss of the waveform signals.

The port detection module 201 detects the waveform signal received by the signal input pins INP, INN, and determines if the port 11 is receiving the waveform signals, and then actives the conversion sub-module 203 corresponding to the determined port 11. The conversion sub-module 203 converts the waveform signals to digital data and output the digital data to the computer 3 via the output port 30. In one embodiment, the computer 3 can install a test software, and the computer 3 runs the test software when receiving the digital data, and then analyzes the communication state of the port of the electronic device 2 by the test software.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A data converter for being connected between an electronic device and a computer, the data converter comprising:
   a signal input port comprising a plurality of ports of different types, each port being configured for connecting to a corresponding port of the electronic device and receiving waveform signals from the electronic device:
   a processing unit comprising:
      a port detection module, configured for detecting which port of the signal input port is receiving the waveform signals; and
      a data conversion module comprising a plurality of conversion sub-modules, each conversion sub-module corresponding to one port of the signal input port, when the port detection module detects the port receiving the waveform signals, the conversion sub-module corresponding to the detected port being enabled and converting the waveform signals to digital data;

a voltage follower connected between the signal input port and the processing unit, configured for reducing the loss of waveform signals transmitted to the processing unit; and an output port configured for being connecting to the computer, and outputting the digital data to the computer to analyze the communication state of the port of the electronic device based on the digital data;

wherein each port of the signal input port comprises an anode input terminal for receiving plus waveform signals and a cathode input terminal for receiving minus waveform signals, the voltage follower comprises a first amplifier and a second amplifier, both of the first and the second amplifiers comprise two input ports and an output port, one of the input port of the first amplifier is connect to the anode input terminal of all of the ports, and the other input port is connected to the output port; one of the input port of the second amplifier is connected to the cathode input terminal of all of the ports, and the other input port is connected to the output port.

2. The data converter according to claim 1, wherein the processing unit comprises two signal input pins, and two data output pins, the two signal input pins are respectively connected to the output ports of the first amplifier and the second amplifier.

3. The data converter according to claim 2, wherein the port detection module detects the waveform signals received by the two signal input pins, and determines the port receiving the waveform signals, and then enables the conversion sub-module corresponding to the port receiving the waveform signals.

4. The data converter according to claim 1, wherein a connection line connected between one of the input port and the output port of the first amplifier, and a connection line connected between one of the input port and the output port of the second amplifier are wrapped with a shield case.

* * * * *